United States Patent
Twitchen et al.

(10) Patent No.: US 8,890,091 B2
(45) Date of Patent: Nov. 18, 2014

(54) DIAMOND TOOLS

(75) Inventors: Daniel James Twitchen, Ascot (GB); Sarah Louise Geoghegan, Ascot (GB); Neil Perkins, Ascot (GB)

(73) Assignee: Element Six Limited, Ballasalla (IM)

( * ) Notice: Subject to any disclaimer, the term of this patent is extended or adjusted under 35 U.S.C. 154(b) by 54 days.

(21) Appl. No.: 13/698,644

(22) PCT Filed: Jun. 1, 2011

(86) PCT No.: PCT/EP2011/059144
§ 371 (c)(1),
(2), (4) Date: Apr. 3, 2013

(87) PCT Pub. No.: WO2011/151416
PCT Pub. Date: Dec. 8, 2011

(65) Prior Publication Data
US 2013/0205681 A1    Aug. 15, 2013

Related U.S. Application Data

(60) Provisional application No. 61/350,973, filed on Jun. 3, 2010, provisional application No. 61/369,314, filed on Jul. 30, 2010, provisional application No. 61/369,297, filed on Jul. 30, 2010.

(30) Foreign Application Priority Data

Jun. 3, 2010  (GB) ................................. 1009296.3
Jul. 30, 2010  (GB) ................................. 1012807.2
Jul. 30, 2010  (GB) ................................. 1012809.8

(51) Int. Cl.
| | | |
|---|---|---|
| *C01B 31/06* | (2006.01) | |
| *C09K 3/14* | (2006.01) | |
| *B24D 99/00* | (2010.01) | |
| *C30B 33/04* | (2006.01) | |
| *C30B 29/04* | (2006.01) | |
| *B24D 18/00* | (2006.01) | |

(52) U.S. Cl.
CPC . *C09K 3/14* (2013.01); *B24D 99/00* (2013.01); *C01B 31/065* (2013.01); *C30B 33/04* (2013.01); *C09K 3/1409* (2013.01); *C30B 29/04* (2013.01); *B24D 18/00* (2013.01)
USPC ........................................................... 250/492.1

(58) Field of Classification Search
USPC ........................................................... 250/492.1
See application file for complete search history.

(56) References Cited

U.S. PATENT DOCUMENTS

| 4,012,300 A | 3/1977 | Caveney |
| 4,184,079 A | 1/1980 | Hudson et al. |

(Continued)

FOREIGN PATENT DOCUMENTS

| EP | 0014528 B1 | 8/1980 |
| EP | 0275063 A2 | 7/1988 |

(Continued)

OTHER PUBLICATIONS

Breeding, C., et al., "The 'Type' Classification System of Diamond and its Importance in Gemology," Gems and Gemology, vol. 45, No. 2, 96-111, 2009.

(Continued)

*Primary Examiner* — Kiet T Nguyen
(74) *Attorney, Agent, or Firm* — Bryan Cave LLP

(57) ABSTRACT

A method comprising: selecting a diamond material; irradiating the diamond material to increase toughness and/or wear resistance of the diamond material; and processing the diamond material into one or more diamond tool pieces, wherein the diamond material is selected from the group consisting of: a HPHT diamond material having a total equivalent isolated nitrogen concentration in the range 1 to 600 ppm; a CVD diamond material having a total equivalent isolated nitrogen concentration in the range 0.005 to 100 ppm; and a natural diamond material having a total nitrogen concentration in the range 1 to 2000 ppm, wherein the irradiating comprises controlling energy and dosage of irradiation to provide the diamond material with a plurality of isolated vacancy point defects, the isolated vacancy point defects having a concentration in a range $1\times10^{14}$ to $1\times10^{21}$ vacancies/cm$^{-1}$.

33 Claims, 3 Drawing Sheets

(56) References Cited

U.S. PATENT DOCUMENTS

| | | |
|---|---|---|
| 4,273,561 A | 6/1981 | Villalobos |
| 4,319,889 A | 3/1982 | Villalobos |
| 4,533,812 A | 8/1985 | Lorenz |
| 5,366,522 A | 11/1994 | Nakamura et al. |
| 2006/0065187 A1 | 3/2006 | Hemley |
| 2009/0065187 A1 | 3/2009 | Son |
| 2009/0110626 A1 | 4/2009 | Hemley |
| 2010/0326135 A1* | 12/2010 | Twitchen et al. ............ 63/26 |
| 2010/0329965 A1* | 12/2010 | Twitchen et al. ......... 423/446 |

FOREIGN PATENT DOCUMENTS

| | | |
|---|---|---|
| EP | 0316856 A1 | 5/1989 |
| EP | 0615954 A1 | 9/1994 |
| EP | 1990313 A1 | 11/2008 |
| GB | 1588418 A | 4/1981 |
| GB | 1588445 A | 4/1981 |
| GB | 2481283 | 7/2013 |
| GB | 2481285 B | 7/2013 |
| GB | 2481284 B | 8/2013 |
| JP | 50-124290 A | 9/1975 |
| JP | 59-229227 A | 12/1984 |
| JP | 02-87691 A | 3/1990 |
| JP | 6-79504 A | 3/1994 |
| JP | 10-236899 A | 9/1998 |
| JP | 11-071197 A | 3/1999 |
| JP | 2006-21963 A | 1/2006 |
| JP | 2006021963 A | 1/2006 |
| JP | 2006-518699 A | 8/2006 |
| JP | 2008-229810 A | 10/2008 |
| JP | 2010-526746 A | 8/2010 |
| RU | 1813812 A1 | 5/1993 |
| SU | 1346418 A1 | 10/1987 |
| WO | 99/48107 A1 | 9/1999 |
| WO | 01/79583 A1 | 10/2001 |
| WO | 2004/066894 A1 | 8/2004 |
| WO | 2004/074557 A1 | 9/2004 |
| WO | 2005/088283 A1 | 9/2005 |
| WO | 2010/149775 A1 | 12/2010 |
| WO | 2010/149777 A1 | 12/2010 |
| WO | 2010/149779 A1 | 12/2010 |

OTHER PUBLICATIONS

Davies, G., "Current Problems in Diamond: Towards a Quantitative Understanding," Physica B, vols. 273-274, 15-23 1999.

Uedono A. et al., "Annealing Behaviours of Defects in Electron-Irradiated Diamond Probed by Positron Annihilation," vol. 11, No. 25, 4925-4934, 1999.

Vlasov et al., "Relative Abundance of Single and Vacancy-Bonded Substitutional Nitrogen in CVD Diamond," Phys. Stat. Sol. (a) 181, 83-90, 2000.

Karkin et al., "Neutron Irradiation Effects in Chemical-Vapor-Deposited Diamond," Phys. Rev. B, vol. 78, No. 3, 033204-1-3, 2008.

Davies, et al., "Vacancy-Related Centers in Diamond," Phys. Rev. B, vol. 46, No. 20,157-170,1992.

Webb, et al., "Correlation of Substitutional Nitrogen in Synthetic Saw-Grade Diamond to Crystal Fatigue Resistance," Diamond and Related Materials, 305-308, 1998.

Denning, "Selected Properties of Neutron Irradiated Diamond," The American Mineralogist, vol. 49, 72-105 , Jan. 1963.

Hamilton et al., "Effect of Heavy Charged Particle and Fast Neutron Irradiation on Diamonds," University of California Manuscript, 941-949, 1952.

UK File History for GB 2481285 B dated Jun. 1, 2011 to Jul. 17, 2013.

UK File History for GB 2481284 B dated Jun. 1, 2011 to Aug. 7, 2013.

UK File History for GB 2481283 B dated Jun. 1, 2011 to Jul. 17, 2013.

* cited by examiner

DIAMOND TOOLS

FIELD OF INVENTION

The present invention relates to diamond tools and methods of making the same.

BACKGROUND OF INVENTION

For any application a user must consider a number of factors when choosing a tool material. Such factors including: cost; toughness; wear rate/hardness; ability to process a desired working surface such as a cutting edge; useful lifetime; and inertness to chemical effects with the material to be processed.

An ideal tool material is one which is both hard and tough. These two properties of materials used in wear and tear applications are often presented on two perpendicular axes. Very simply, wear is a measurement of the amount of material removed per unit of operation. Toughness is a measure of a material's resistance to crack propagation.

There is an ongoing desire to provide materials which are harder, tougher, stronger and more wear resistant. There is also an ongoing desire to provide faster, more precise and cleaner production methods which add up to cost efficiency and improved performance. It is an aim of certain embodiments of the present invention to at least partially address some of these needs.

Diamond materials are the materials of choice for many premium performance cutting, drilling, grinding and polishing tools. Diamond materials are used in tooling solutions across a range of industries including a variety of metal, stone and woodworking industries. Examples include aerospace and automotive manufacturing, furniture production, stone quarrying, construction, mining and tunnelling, mineral processing, and the oil and gas industries.

Diamond's hardness properties make it the ultimate material in terms of wear. However, diamond's limited ability to plastically deform under stress at the tool's working temperature leads to more rapid crack propagation in comparison to much tougher materials such as steel.

Previous attempts to improve the durability of diamond have involved either adapting the method of forming the diamond material or treating the diamond material after forming the material. For example, WO 01/79583 teaches a process for improving the durability of a diamond-type tool to increase the impact strength and fracture toughness. The process involves implanting ions into the surface of a diamond-type tool. Ion implantation is a materials engineering process by which ions of a material can be implanted into another solid, thereby changing the physical properties of the solid. Under typical circumstances ions are implanted to a depth in the range 10 nanometers to 1 micrometer. WO 01/79583 teaches ion implantation which penetrates a diamond surface to a depth in the range 0.02 µm to 0.2 µm. Preferred ions include chromium, nickel, ruthenium, tantalum, titanium and yttrium.

U.S. Pat. No. 4,184,079 and GB 1588445 also teach a method for toughening diamond by bombarding the diamond with ions of sufficient energy to penetrate the diamond surface. Various ions are suggested including carbon, nitrogen and hydrogen ions. It is described that the ions form a dislocation network in the diamond crystal lattice thereby inhibiting microcleavage of the diamond. It is further described that the dislocations can be confined to a depth of from 10 nanometers to 1 micrometer below the surface of the diamond crystals in order to form a hard skin on the surface thereof. It is taught that the dose of ions should be quite small, in the range $10^{16}$ to $10^{18}$ ions cm$^{-2}$, and have energies in the range 10 keV to 10 MeV, more preferably less than 100 keV so that the species implanted by the bombardment do not have a detrimental effect on the diamond material. As ion bombardment of diamond results in the amorphisation and softening of the surface unless the temperature is held sufficiently high to maintain the crystal structure, it is taught to use a temperature of at least 500° C. during ion bombardment.

GB 1588418 discloses a process for improving the wear characteristics of industrial diamonds. The process comprises implanting ions into the surface of the diamond. Carbon and nitrogen ions are suggested for this purpose.

U.S. Pat. No. 4,012,300 discloses a method of altering the friability of abrasive particles, particularly diamond and cubic boron nitride particles, by subjecting the particles to irradiation. Proton, neutrons and gamma radiation are suggested with neutrons being preferred.

US2006065187 discloses a tough CVD diamond material which is grown in an atmosphere having a nitrogen to methane ratio of about 4% $N_2/CH_4$ at about 1050° C.-1200° C. and then annealed.

US2009110626 teaches that nitrogen containing single crystal CVD diamonds treated by a low pressure, high temperature annealing process have a high toughness.

It is an aim of certain embodiments of the present invention to improve the toughness and/or wear resistance of diamond tools. It is a further aim of certain embodiments of the present invention to avoid some of the problems associated with the aforementioned methods.

SUMMARY OF INVENTION

According to one aspect of the present invention there is provided a method comprising:
  selecting a diamond material;
  irradiating the diamond material to increase toughness and/or wear resistance of the diamond material; and
  processing the diamond material into one or more diamond tool pieces, wherein the diamond material is selected from the group consisting of:
    a HPHT diamond material having a total equivalent isolated nitrogen concentration in the range 1 to 600 ppm;
    a CVD diamond material having a total equivalent isolated nitrogen concentration in the range 0.005 to 100 ppm; and
    a natural diamond material having a total nitrogen concentration in the range 1 to 2000 ppm,
  wherein the irradiating comprises controlling energy and dosage of irradiation to provide the diamond material with a plurality of isolated vacancy point defects, the isolated vacancy point defects having a concentration in a range $1 \times 10^{14}$ to $1 \times 10^{21}$ vacancies/cm$^{-3}$.

The present invention proposes that there is an interaction between the mechanism by which irradiation increases toughness and/or wear resistance of diamond material and the mechanism by which nitrogen within the diamond crystal matrix increases toughness and/or wear resistance. Although this mechanism is not fully characterized, one possibility is that irradiation introduces a relatively even distribution of vacancy defects within the crystal matrix which can act as crack stops and/or introduce regions of stress/strain within the diamond crystal matrix which may act to inhibit crack propagation and increase toughness. Nitrogen impurities within the crystal matrix may function to trap vacancies introduced by the irradiation to form N—V—N or N—V centres. During manufacture, and in use, a diamond tool piece becomes hot. As such, vacancies introduced by irradiation may become mobile within the crystal matrix. However, it is desirable to provide a relatively even distribution of vacancies within the crystal matrix to act as crack stops. As such, a relatively even distribution of vacancies introduced by irradiation may be maintained by ensuring that a suitable concentration of nitrogen is present within the crystal matrix to prevent the vacancies migrating through the diamond crystal structure. The vacancy point defects may be in the neutral ($V^0$) and negative charge states ($V^-$). The total vacancy concentration ($[V_T]=[V^0]+[V^-]$) may be in the range: $1\times10^{14}$ to $1\times10^{22}$ vacancies/cm$^{-3}$; $1\times10^{14}$ to $1\times10^{21}$ vacancies/cm$^{-3}$; $1\times10^{14}$ to $1\times10^{20}$ vacancies/cm$^3$; $1\times10^{15}$ to $1\times10^{21}$ cm$^{-3}$; $5\times10^{15}$ to $1\times10^{20}$ vacancies/cm$^{-3}$; $1\times10^{15}$ to $1\times10^{19}$ vacancies/cm$^3$; $1\times10^{15}$ to $1\times10^{18}$ vacancies/cm$^3$; $1\times10^{15}$ to $1\times10^{17}$ vacancies/cm$^3$; $1\times10^{16}$ to $5\times10^{19}$ vacancies/cm$^{-3}$; or $5\times10^{16}$ to $1\times10^{19}$ vacancies/cm$^{-3}$ or $1\times10^{16}$ to $1\times10^{17}$ vacancies/cm$^3$.

In addition to the above, it has been recognized that CVD, HPHT, and natural diamond are structurally different materials with, for example, different distributions of nitrogen. Natural diamond for example, tends to have aggregated nitrogen defects (Type Ia) whereas synthetic CVD and HPHT diamond material tends to have isolated nitrogen defects (Type Ib). Materials having different types and distributions of nitrogen defects behave differently after being subjected to irradiation. Furthermore, the nitrogen content can affect other characteristics such as CVD diamond growth. As such, the optimum amount of nitrogen required to be present in the diamond material to interact with vacancy defects introduced by irradiation will vary according to the type of diamond material which is irradiated.

In light of the above, and in accordance with the present invention, it is proposed that for irradiated material, the optimum isolated nitrogen concentration for HPHT diamond material lies in the range 1 to 600 ppm, the optimum isolated nitrogen concentration for CVD diamond material lies in the range 0.005 to 100 ppm, and the optimum isolated nitrogen concentration for natural diamond material lies in the range 1 to 2000 ppm. Using such materials, the irradiation and the nitrogen act in a compatible manner to provide a tougher more wear resistant material.

The HPHT diamond material may have a total equivalent isolated nitrogen concentration in the range 10 to 300 ppm, 10 to 200 ppm, 50 to 250 ppm, 100 to 200 ppm, 10 to 100 ppm, or 10 to 50 ppm.

The CVD diamond material may have a total equivalent isolated nitrogen concentration in the range 0.01 to 50 ppm, 0.05 to 20 ppm, 0.08 to 5 ppm, or 0.1 to 2 ppm.

The natural diamond material may have a total nitrogen concentration in the range 200 to 2000 ppm, 500 to 1500 ppm, 800 to 1300 ppm, or 1000 to 1200 ppm.

It is to be noted that the nitrogen concentrations discussed above are measured as an average concentration over a majority volume of the diamond material. The majority volume may be greater than or equal to 50%, 60%, 70%, 80%, or 90% of the total volume of the diamond material. This is to account for the fact that different diamond growth sectors have different rates of nitrogen uptake leading to concentration variations.

The total equivalent isolated nitrogen concentration for a diamond material can be measured by techniques known by persons skilled in the art, for example the concentration can be calculated by deconvoluting the absorption spectrum of the one phonon part of the FTIR spectrum. The total concentration of nitrogen including aggregated nitrogen may be determined using secondary ion mass spectroscopy (SIMS).

The irradiation may comprise electrons, neutrons, X-rays, gamma radiation, protons, or alpha particles.

The irradiation should be of sufficient energy to generate isolated vacancies or relatively small cluster defects in the diamond material which can act as crack stops. If the energy if the radiation is relatively high or the radiation comprises relatively heavy particles, carbon atoms are knocked off their lattice sites with enough energy to knock further carbon atoms of their lattice sites resulting in what is known as cascade damage. This results in clusters of defects and a region of stress/strain within the diamond crystal matrix which may act to inhibit crack propagation and increase toughness. Small cluster defects are acceptable. However, if the energy of the radiation is too high, the cascade damage becomes too extensive and toughness and/or wear resistance is reduced. Furthermore, if the energy of the radiation is too low, the radiation does not penetrate sufficiently into the diamond material to provide a bulk treatment of the diamond material.

In light of the above, it is advantageous to irradiate the diamond material in order to form a large number of relatively evenly spaced isolated vacancies or small cluster defects without the individual clusters becoming too large in size. If cluster defects are formed, they should preferably have a maximum length no greater than 50 atoms, 20 atoms; 10 atoms; or 5 atoms in length. The size of the cluster defects can be measured using transmission electron microscopy (TEM) or positron annihilation techniques.

The energy of the radiation will depend on the type of radiation and the mechanism of energy transfer between the radiation and a carbon atom it hits within the diamond crystal matrix. The dose of radiation will also depend on the type of radiation and the number of vacancies produced per particle of radiation.

An iterative process can be used to find optimum vacancy defect levels. A diamond material can be irradiated, tested, re-irradiated, and so on to find the optimum defect levels for a particular diamond material for a particular type of tool piece and tool application.

According to certain embodiments, the irradiation is preferably above an energy and dose rate which leads to a change in colour of the diamond material. It is also advantageous that the irradiation is kept below an energy and dose rate which would lead to amorphization of the diamond material. Amorphization has a detrimental effect on the mechanical properties of the diamond material. In general, the longer the irradiation dose the more vacancy defects will be introduced. However, the rate of vacancy incorporation may vary according to the nature of the starting material.

For electrons, the irradiation may have an energy: 30 keV or greater; in the range 0.1 MeV to 12 MeV; in the range 0.5 MeV to 10 MeV; in the range 1 MeV to 8 MeV; or in the range 4 MeV to 6 MeV. The dosage of electron irradiation may be: $1\times10^{15}$ e$^-$/cm$^2$ or greater; in the range $1\times10^{16}$ e$^-$/cm$^2$ to $1\times10^{19}$ e$^-$/cm$^2$; in the range $1\times10^{17}$ e$^-$/cm$^2$ to $1\times10^{19}$ e$^-$/cm$^2$; or in the range $2\times10^{18}$ e$^-$/cm$^2$ to $1\times10^{19}$ e$^-$/cm$^2$.

For neutrons, the irradiation may have an energy: in the range 1.0 keV to 12 MeV; in the range 1.0 keV to 10 MeV; in the range 100 keV to 8 MeV; in the range 100 keV to 6 MeV; or in the range 500 keV to 4 MeV. The neutrons will tend to be distributed over a range of energies. Accordingly, at least 50%, at least 60%, at least 70%, or at least 80% of the neutrons fall within one of the aforementioned ranges. The dosage of neutron irradiation may be: $1\times10^{14}$ neutrons/cm$^2$ or greater; in the range $1\times10^{14}$ neutrons/cm$^2$ to $1\times10^{18}$ neutrons/cm$^2$; in the range $1\times10^{15}$ neutrons/cm$^2$ to $5\times10^{17}$ neutrons/cm$^2$; or in the range $1\times10^{15}$ neutrons/cm$^2$ to $1\times10^{17}$ neutrons/cm$^2$.

For gamma rays, the irradiation may have an energy in the range 0.1 to 12 MeV, 0.2 to 10 MeV, or 0.3 to 8 MeV. The dosage of gamma ray irradiation may be $5\times10^{16}$ γ-ray/cm$^2$ or greater, in the range $1\times10^{17}$ to $5\times10^{21}$ γ-ray/cm$^2$, or in the range $5\times10^{17}$ to $1\times10^{21}$ γ-ray/cm$^2$.

During irradiation according to certain embodiments of the present invention, the temperature of the diamond material is kept relatively low. For example, the temperature may be: 500° C. or less; 400° C. or less; 300° C. or less; 200° C. or less; 100° C. or less; or 50° C. or less. In order to keep the temperature down, the diamond material may be actively cooled during irradiation. It is advantageous to keep the temperature relatively low as an increase in temperature can result in a decrease in the number density of vacancy defects.

The method may also comprise the optional step of annealing the diamond material in addition to treatment by irradiation. The annealing step may be performed before, during or after the irradiation step, or any combination thereof. In certain applications it may be preferred to perform an annealing step before irradiating as an annealing step after irradiating can result in a decrease in vacancy defects. The annealing may be performed at a temperature of 1600° C. or greater, 1800° C. or greater, 2200° C. or greater, or 2400° C. or greater. Embodiments of the present invention may include a combination of irradiating and a relatively low temperature anneal, or a combination of irradiating and a high pressure high temperature anneal. Embodiments also envisage the possibility of iterative doses of radiation and/or iterative annealing. That is, more than one annealing and/or irradiation step may be performed. For example, the diamond material may be annealed, then irradiated, and then annealed. Further alternating irradiation and annealing steps may also be performed. Alternatively, the diamond material may not be exposed to any substantial annealing step, at least after irradiation. By substantial annealing step, we mean an annealing step which substantially and measurably changes the properties of the material. Annealing below 1800° C. can be conducted in an inert atmosphere whereas annealing above 1800° C. may require stabilising pressures, especially if a long anneal is performed. The annealing is typically conducted for 30 seconds up to 50 hours. By inert atmosphere, we mean an atmosphere under which the diamond will not significantly degrade during annealing. Examples include Argon and Neon.

A relatively low temperature anneal may be advantageous for certain applications. In use, the diamond material can get hot, and most methods of mounting the diamond tool piece also include brazing at, for example, 900° C. As such, a low temperature anneal can be useful to ensure a consistent performance of the diamond tool pieces in use. For example, a low temperature anneal at a temperature of 1500° C. or less, 1300° C. or less, 1200° C. or less, 1100° C., or less, or approximately 1000° C. can be useful for certain applications.

The irradiation may be performed before, during, or after processing to form one or more tool pieces. The processing may involve treating, grinding, cutting and/or shaping the diamond material to form one or more diamond tool pieces, each tool piece having a working surface such as a cutting blade. For example, the processing may comprise forming one of: a wear part; a dresser; a wire drawing die; a gauge stone; and a cutter. For example, a tool piece may comprise a cutting edge having a length greater than or equal to 0.5 mm, 1 mm, 1.5 mm, or 2 mm. The method may further comprise incorporating the one or more diamond tool pieces into one or more tools and the irradiating may be performed before, during, or after this incorporating step.

Irradiating the diamond material prior to incorporating the material into a tool is advantageous in that the increase in toughness and/or wear resistance as a result of the irradiation can reduce the likelihood of the diamond material being damaged during the processing steps involved in incorporating the diamond material into the tool. Furthermore, other components in the tool may be damaged by the radiation and this is avoided if the diamond material is irradiated prior to the diamond material being incorporated into the tool. For example, it is know that irradiation can reduce the toughness of metallic materials such as steel. Further still, existing manufacturing processes for forming tools using diamond material do not need to be altered in any way if the diamond is pre-treated prior to tool manufacture.

On the other hand, irradiating the diamond material after the diamond material has been incorporated into the tool has the advantage that existing diamond tools can be treated to increase their toughness and/or wear resistance. Further still, the irradiation can be directed to particular portions of the diamond material within the tool where it is desired to increase the toughness and/or wear resistance. This avoids the need to irradiate other portions of the diamond material which may not be required to have an increased toughness and/or wear resistance in use.

In addition to improving the toughness and/or wear resistance of the tool, an increase in toughness and/or hardness of the diamond can allow the diamond material to be processed in different ways. For example, an increase in toughness can allow the diamond material to be processed to a sharper edge for more precise cutting without the edge cracking or chipping during processing or in use.

The diamond material can be irradiated to a depth of 1 μm or greater, 10 μm or greater, 100 μm or greater, 500 μm or greater or 1 mm or greater. The diamond material may be irradiated throughout a total thickness of the diamond material.

The diamond material may also be exposed to radiation on more than one side of the material. For example, a diamond plate may be exposed on both main faces to achieve an even exposure of radiation. Similarly, a plurality of small particles may be shaken during irradiation such that the particles roll and receive a reasonably even exposure to the radiation over their surface. Rotation of the sample during irradiation, or repeated rotation followed by irradiation, can assist in achieving irradiation throughout the volume of diamond material and/or assist in achieving a relatively even distribution of vacancy defects.

An advantage of certain embodiments of the present invention over prior art ion implantation methods is that embodiments of the present invention can be more cost effective. This is because certain embodiments provide a bulk treatment of the diamond material rather than just a surface treatment. Accordingly, the irradiation can be done before processing the diamond material into a tool piece and incorporating the tool piece into a tool. Furthermore, bulk treatment can be applied to a large volume of material pieces with relatively simple handling requirements. For example, diamond pieces do not need to be carefully mounted in a certain orientation as is required for many surface treatments. In contrast, prior art ion implantation methods need to be performed after processing of the diamond material. This is because prior art ion implantation methods generally result in an increase in toughness only near the surface of the diamond material. Processing of the material into a tool piece by, for example, cutting, shaping and/or grinding the diamond material will remove the treated surface of such materials. Another advantage of certain embodiments of the present invention is that the tool pieces can be re-worked without having to re-treat the tool pieces. A further advantage is that irradiation prior to processing to form a tool piece can improve the working surface achievable by the processing. For example, an irradiated diamond material with increased toughness can be processed to a sharper cutting edge for more precise cutting without chipping or cracking the cutting edge during processing.

The diamond material according to embodiments of the invention may be natural diamond or synthetic diamond. The synthetic diamond may be formed by a high pressure high temperature (HPHT) method or by a chemical vapour deposition (CVD) method. The diamond material could be single crystal, polycrystalline, grit, diamond-like-carbon (DLC), or a composite diamond material such as diamond grains dispersed in a metal matrix (usually cobalt and known as PCD) or an inorganic matrix (such as silicon carbide and known as skeleton cemented diamond or ScD). The diamond material may comprise crystals having a size: 1 nm or greater; 100 nm or greater; 500 nm or greater; 1 micrometer or greater; 5 micrometer or greater; 0.5 mm or greater; 1 mm or greater; 3 mm or greater; or 10 mm or greater. The diamond material may comprise one or more crystals and may form a body having at least one dimension up to, for example, 200 mm or more (for example, in a polycrystalline diamond plate or dome). The invention is particularly suited for application to HPHT and CVD diamond. However, certain embodiments may also be applied to natural diamond.

Certain embodiments of the present invention propose to use neutron irradiation for increasing the toughness and/or wear resistance of diamond tool pieces having at least one dimension of 1 mm or greater, 1.5 mm or greater, or 2 mm or greater. U.S. Pat. No. 4,012,300 describes a method of decreasing the friability (increasing the friability index) of natural diamond grit of 120/140 U.S. mesh (approximately 0.1 mm maximum particle diameter) or 30/40 U.S. mesh (approximately 0.5 mm maximum particle diameter) by irradiating the grit, in particular with neutrons. According to Zhou et al (Zhou, Y., Takahashi, T., Quesnel, D. J., Funknebusch, P. D., 'Friability and Crushing Strength of Micrometer-Size Diamond Abrasives Used in Microgrinding of Optical Glass', Metallurgical and Materials Transactions A, 27A (1996), 1047-1053), friability is a measure of the crushing strength of material when in the form of particulates under compressive impact loading conditions. In contrast to U.S. Pat. No. 4,012,300 which teaches the use of neutron irradiation for decreasing the friability of small diamond particles, certain embodiments of the present invention propose to use irradiation for increasing the toughness and/or wear resistance of larger diamond tool pieces. It has been found that radiation can form a suitable distribution of defects of the correct size throughout a relatively large piece of diamond material in order to increase the toughness and/or wear resistance of a diamond tool piece. This is neither disclosed nor suggested in U.S. Pat. No. 4,012,300.

According to certain embodiments of the present invention the diamond material may be Type Ia, Type Ib, or Type IIa.

Preferably, the irradiation increases the useful lifetime of the diamond tool piece by 10% or greater, preferably 20% or greater, more preferably 50% or greater of the lifetime of an untreated diamond tool piece.

In addition to increasing the toughness and/or wear resistance of diamond tools, the irradiation treatment of embodiments of the present invention has the bonus effect of producing diamond tool pieces with more desirable colours. A tool of a specific colour is useful as the colour also relates to its performance, thus giving the tools of the present invention a distinctive colour branding in addition to performance advantages. Traditionally, synthetic diamond tool pieces have generally contained diamond material which is yellow in colour. Particularly good results have been obtained by starting with a yellow, most preferably deep yellow, diamond material and irradiating the yellow diamond material in order to increase toughness and/or wear resistance. The irradiation can also change the colour of the yellow diamond material. A range of colours may be achieved depending on the exact type of starting material, the type of radiation, and whether an annealing step is performed in addition to irradiation. For example, colourless or near colourless CVD diamond may turn blue or yellowish-green when irradiated in accordance with an embodiment of the present invention. If irradiated and then heated to a temperature greater than approximately 700° C. then the CVD diamond which was originally colourless or near colourless may turn colourless, orange, brown or a pink colour dependant on irradiation and annealing treatment. In contrast, yellow HPHT Type Ib diamond may turn green when irradiated (depending on dose) in accordance with an embodiment of the present invention. If irradiated and then heated to a temperature greater than approximately 700° C. then the yellow HPHT Type Ib diamond may turn a red or purple colour (depending on irradiation and anneal). In certain cutting application, the green diamond obtained by irradiating HPHT Type Ib diamond has been found to give particularly good results.

Further still, the colour of diamond material according to certain embodiments of the present invention can change, for example, when a certain temperature is exceeded for a certain length of time. This colour change can be used as a quality control indicator and/or an indicator that a diamond tool piece requires replacement. For example, a green HPHT Type Ib diamond tool piece according to one embodiment of the present invention may turn red/purple after prolonged use at high temperatures. This can act as an indicator that the diamond tool piece requires replacement and/or if there is excessive heating due to manufacturing issues, e.g. with the mounting or tool design and therefore excessive heating is occurring.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
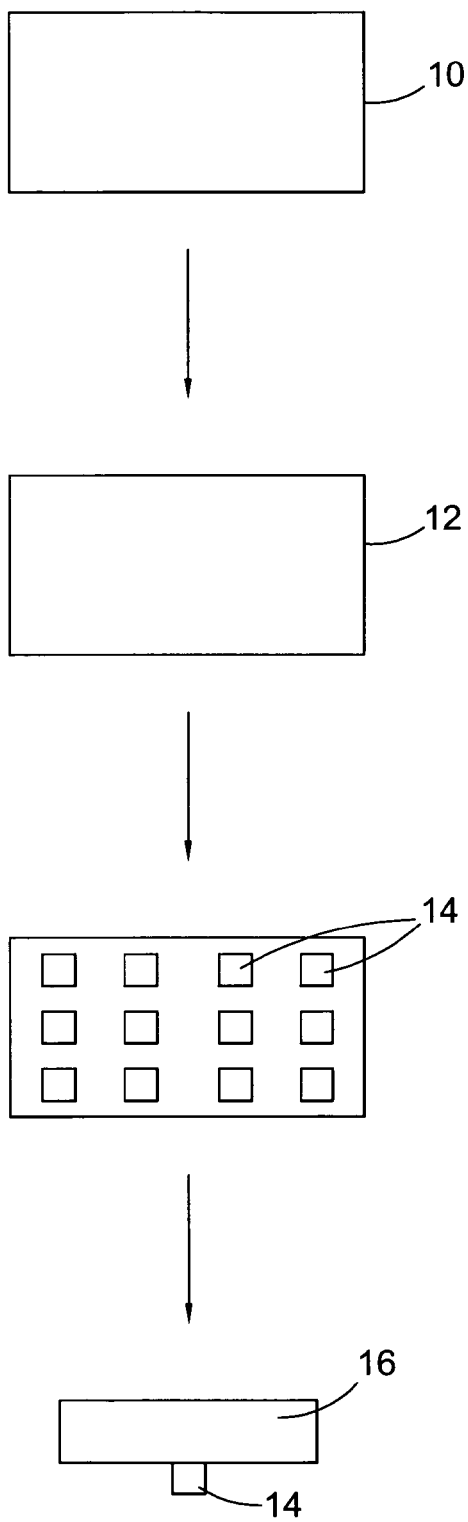
FIG. 1 illustrates the basic steps involved in performing a method according to an embodiment of the present invention.

FIG. 1 illustrates the basic steps involved in performing a method according to an embodiment of the present invention. A diamond material 10 is irradiated to form a diamond material 12 with increased toughness and/or wear resistance. The diamond material 12 is then cut, for example using a laser or mechanical cutter, to form one or more diamond tool pieces 14. One or more diamond tool pieces 14 are then brazed to a carrier 16 to form a diamond tool.

Figure 2:
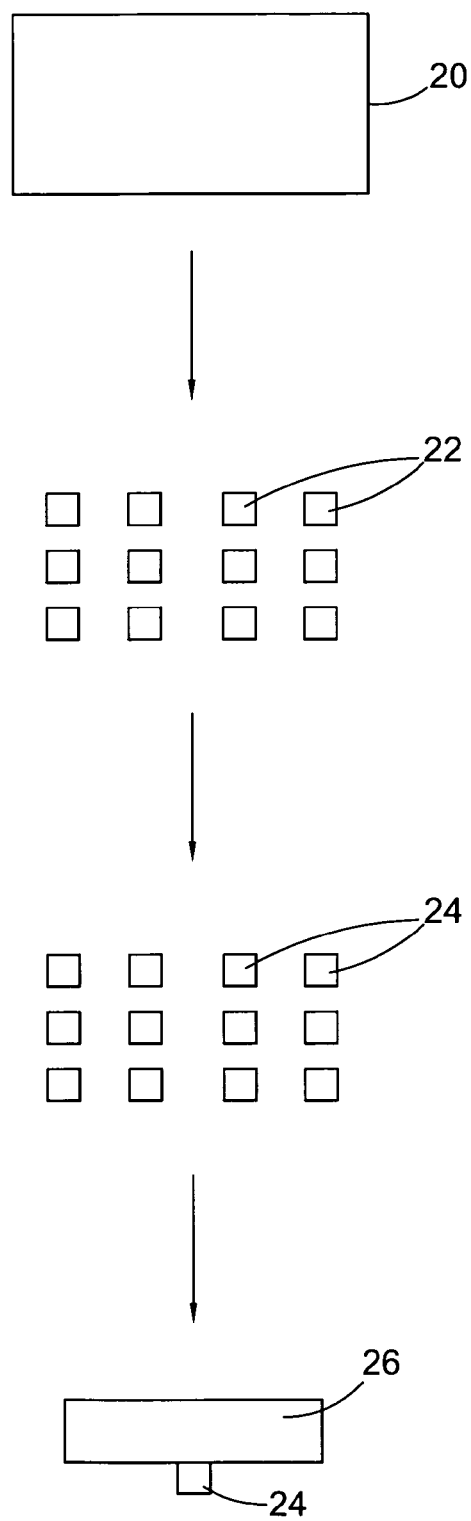
FIG. 2 illustrates the basic steps involved in performing a method according to another embodiment of the present invention.

FIG. 2 illustrates the basic steps involved in performing a method according to another embodiment of the present invention. A diamond material 20 is cut, for example using a laser or mechanical cutter, to form one or more diamond tool pieces 22. The one or more diamond tool pieces 22 are then irradiated to form irradiated diamond tool pieces 24. One or more irradiated diamond tool pieces 24 are then brazed to a carrier 26 to form a diamond tool.

Figure 3:
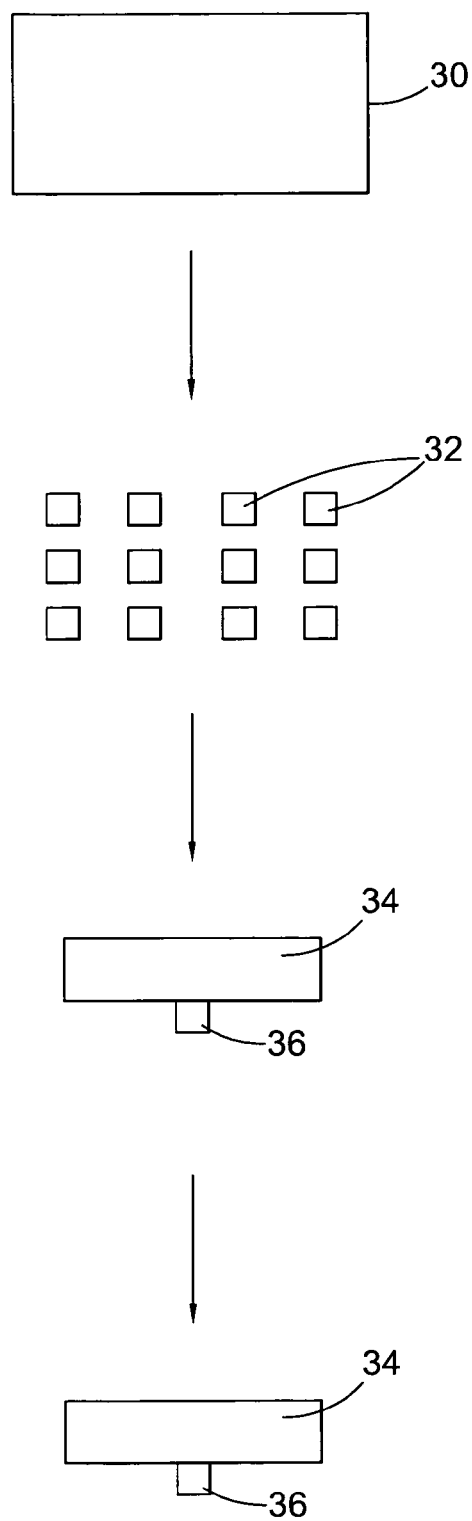
FIG. 3 illustrates the basic steps involved in performing a method according to another embodiment of the present invention.

FIG. 3 illustrates the basic steps involved in performing a method according to another embodiment of the present invention. A diamond material 30 is cut, for example using a laser or mechanical cutter, to form one or more diamond tool pieces 32. One or more diamond tool pieces 32 are then brazed to a carrier 34 to form a diamond tool. The one or more diamond tool pieces 34 are then irradiated to form irradiated diamond tool pieces 36.

The described embodiments of the present invention provide a method of increasing toughness and/or wear resistance of a tool comprising diamond material, the method comprising irradiating the diamond material to increase toughness and/or wear resistance. The irradiation treatments form vacancy defects in the diamond material which can be trapped by nitrogen within the diamond matrix.

The diamond material used in embodiments of the present invention may be natural diamond, HPHT diamond and CVD diamond. It will be understood that natural diamond, HPHT diamond and CVD diamond have their own distinctive structural and functional characteristics and thus the terms "natural", "HPHT" and "CVD" not only refer to the method of formation of the diamond material but also refer to specific structural and functional characteristics of the materials themselves. For example, a synthetic CVD diamond material may be unequivocally distinguished from a synthetic diamond material synthesized using HPHT techniques by the dislocation structure. In synthetic CVD diamond, dislocations generally thread in a direction that is roughly perpendicular to the initial growth surface of the substrate, i.e. where the substrate is a {001} substrate, the dislocations are approximately aligned parallel to the [001] direction. This is not true for synthetic diamond material synthesized using HPHT techniques. Thus the two types of material can be distinguished by their different dislocation structures observed, for example, in an X-ray topograph.

The diamond material used in embodiments of the present invention may be Type Ia, Type Ib, of Type IIa. Type Ia and Type Ib diamonds contain nitrogen. Although Type IIa diamonds are usually defined as containing no nitrogen, in practice they can contain low concentrations of nitrogen. In Type Ia, the nitrogen atoms form various types of aggregate defect whereas in Type Ib diamonds, the nitrogen atoms tend to be isolated as single impurities. Type Ia diamonds can be colourless, brown, pink, and violet. Natural Type Ib diamonds can be deep yellow ("canary"), orange, brown or greenish. The colour of a diamond is determined by the number, type and distribution of defects within the crystal structure. Crystal defects include dislocations, microcracks, twin boundaries, point defects, and low angle boundaries. As such, for example, the colour of diamond will depend on the type and distribution of impurities such as nitrogen as well as the type and distribution of other defects such as dislocations. There is a large number of different types and subclasses of defects within diamond. For example, there are numerous different types of nitrogen defect alone, each having its own spectral characteristics.

The tools formed by embodiments of the present invention may be used for a range of applications including cutting, grinding, polishing, drilling and/or wire drawing. Particularly good results have been obtained to date for cutting applications and wire drawing.

The diamond material in the tool may be configured into a number of possible crystallographic orientations including 2-point, 3-point and 4-point crystals which correspond to {110}, {111} and {100} crystallographic planes respectively. Particularly good results have been obtained for 3-point HPHT Type Ib diamond in a wire drawing tool and 2-point HPHT Type Ib diamond in a cutting tool. Optionally, the working surface of the diamond tool piece is formed by a single sector of diamond material.

EXAMPLES

Electron Irradiation

Electron irradiation (for example, using electrons with energies less than or equal to 12 MeV) typically introduces vacancies in an isolated form. These may be in the neutral ($V^0$) and negative charge states ($V^-$). The total vacancy concentration ($[V_T]=[V^0]+[V^-]$) post irradiation should preferably be in the range: $1\times10^{14}$ to $1\times10^{21}$ vacancies/$cm^3$; $1\times10^{15}$ to $1\times10^{21}$ vacancies/$cm^3$; $5\times10^{15}$ to $1\times10^{20}$ vacancies/$cm^3$; $1\times10^{16}$ to $5\times10^{19}$ vacancies/$cm^3$; or $5\times10^{16}$ to $1\times10^{19}$ vacancies/$cm^3$. Such a concentration of defects can be formed, for example, using electron irradiation having a dose rate: $1\times10^{15}$ $e^-/cm^2$ or greater; in the range $1\times10^{16}$ $e^-/cm^2$ to $1\times10^{19}$ $e^-/cm^2$; in the range $1\times10^{17}$ $e^-/cm^2$ to $1\times10^{19}$ $e^-/cm^2$; or in the range $2\times10^{17}$ $e^-/cm^2$ to $1\times10^{19}$ $e^-/cm^2$.

The electron irradiation may have an energy of: 30 keV or greater; in the range 0.1 MeV to 12 MeV; in the range 0.5 MeV to 10 MeV; or in the range 1 MeV to 8 MeV. The preferred energy is that which introduces a near uniform concentration of vacancies in a nitrogen doped diamond, while minimizing the formation of cascade damage e.g. vacancy chains. For the results reported here it was found that 4.5 MeV provided a good compromise between these two factors.

Factors such as diamond temperature, beam energy, beam flux, and even the starting diamond's properties can affect the $[V_T]$ produced for a fixed experimental irradiation set-up and time. Irradiation is typically carried out with the sample mounted under ambient conditions ~300 K with only minimal temperature rise during the irradiation dose (e.g. less than 100 K). However, factors such as beam energy and beam flux can lead to sample heating. Preferably the sample is held as cold as possible (with even cryogenic cooling at 77 K being advantageous under some circumstances) to enable high dose rates without compromising temperature control and thus minimize the irradiation time. This is advantageous for commercial reasons.

The vacancy concentration can be measured spectroscopically. For example, to measure concentrations of isolated vacancies, spectra are obtained at 77 K, using liquid nitrogen to cool the samples, since at that temperature sharp peaks at 741 nm and 394 nm are seen that are attributable to neutral and negatively charged isolated vacancies respectively. The coefficients that are used for the calculations of concentrations of isolated vacancies in the present specification are those set out by G. Davies in Physica B 273-274 (1999) 15-23, as detailed in Table 1 below. In Table 1, "A" is the integrated absorption (meV $cm^{-1}$) in the zero phonon line of the transition, measured at 77 K, with the absorption coefficient in $cm^{-1}$ and the photon energy in meV. The concentration is in $cm^{-3}$.

TABLE 1

| Defect | Calibration |
|--------|-------------|
| $V^-$ | $A_{ND1} = (4.8 \pm 0.2) \times 10_{-16}[V^-]$ |
| $V^0$ | $A_{GR1} = (1.2 \pm 0.3) \times 10_{-16}[V^0]$ |

According to one arrangement, a yellow Type Ib HPHT synthetic diamond was irradiated with electrons. The electron irradiation was carried out at 4.5 MeV, 20 mA at 50% scan width for 2 hrs using an instrument such as that found at Isotron plc. The overall dose provided to the sample was $1.95 \times 10^{18}$ e$^-$/cm$^2$. The diamond material turned green in colour. No substantial annealing step was performed although the material was subjected to a short heating step when the material was brazed to a carrier to form a tool.

The irradiated diamond material was tested in cutting applications and wire drawing applications. Cutting tests showed that the irradiated diamond out performed natural stones and was far better than any other 2-point or 4-point stone of either synthetic or natural diamond. Wire drawing tests also showed improved performance for the irradiated material. The irradiated diamond material degraded much more slowly than standard synthetic diamond in use. Furthermore, lines and scratches which are sometimes formed in synthetic or natural diamond materials in use were not observed in the irradiated material.

Trials have also been completed on four irradiated 2-point HPHT diamond tools in a fly cutting application. The electron irradiation was carried out at 4.5 MeV, 20 mA at 50% scan width for 2 hrs using an instrument such as that found at Isotron plc, the overall dose provided the sample was $1.95 \times 10^{18}$ e$^-$/cm$^2$. The tool pieces were mounted onto a standard tungsten carbide shank using a standard braze (2-3 mins at 900° C.). They were used in a fly cutting application, processing copper and aluminium for metal optics applications such as $CO_2$ laser mirrors. Such interrupted cutting is a particularly good test as there is repeated impact on the tool pieces. There was an approximately 50% improvement in the tool lifetime of the irradiated HPHT tool pieces compared to untreated HPHT diamond.

According to another arrangement, a colourless or near colourless single crystal CVD diamond plate was irradiated with electrons to form a blue material. This material can be used, for example, to form a cutting blade. The cutting blade can be cut out of a blank plate using, for example, a laser. The blue material can be optionally annealed at approximately 700° C. to form an orange/light brown material.

Neutron Irradiation

Neutron irradiation tends to knock carbon atoms off their lattice sites with enough energy to knock further carbon atoms of their lattice sites resulting in what is known as cascade damage. This results in clusters of defects and a region of stress/strain within the diamond crystal matrix which may act to inhibit crack propagation and increase toughness. If the energy of the neutrons is too high, the cascade damage becomes too extensive and toughness and/or wear resistance is reduced.

In light of the above, it is advantageous to irradiate the diamond material in order to form a large number of isolated and/or relatively small cluster defects without the individual clusters becoming too large in size. It has been found that a suitable size of cluster defects can be formed using neutron radiation having an energy: in the range 1.0 keV to 12 MeV; in the range 1.0 keV to 10 MeV; in the range 100 keV to 8 MeV; in the range 100 keV to 6 MeV; or in the range 500 keV to 4 MeV. The neutrons will tend to be distributed over a range of energies. Accordingly, at least 50%, at least 60%, at least 70%, or at least 80% of the neutrons fall within one of the aforementioned ranges.

Neutron irradiation according to the present invention can introduce a near uniform concentration of isolated vacancies and/or small cluster defects, while minimizing the formation of extensive cascade damage e.g. long vacancy chains. It is difficult to measure the concentration of cluster defects. However, the concentration of isolated defects can be readily characterized spectroscopically. Vacancy point defects may be in the neutral ($V^0$) and negative charge states ($V$). The total isolated vacancy concentration ($[V_T]=[V^0]+[V]$) may be in the range: $1 \times 10^{14}$ to $1 \times 10^{20}$ vacancies/cm$^3$; $1 \times 10^{15}$ to $1 \times 10^{19}$ vacancies/cm$^3$; $1 \times 10^{15}$ to $1 \times 10^{18}$ vacancies/cm$^3$; $1 \times 10^{15}$ to $1 \times 10^{17}$ vacancies/cm$^3$; or $1 \times 10^{16}$ to $1 \times 10^{17}$ vacancies/cm$^3$. The presence of cluster defects can be detected by a broadening of the absorption peak for isolated vacancies. Such a concentration of vacancy defects can be formed, for example, using neutron irradiation having a dose rate: $1 \times 10^{14}$ neutrons/cm$^2$ or greater; in the range $1 \times 10^{14}$ neutrons/cm$^2$ to $1 \times 10^{18}$ neutrons/cm$^2$; in the range $1 \times 10^{15}$ neutrons/cm$^2$ to $5 \times 10^{17}$ neutrons/cm$^2$; or in the range $1 \times 10^{15}$ neutrons/cm$^2$ to $1 \times 10^{17}$ neutrons/cm$^2$.

Embodiments of the present invention envisage the possibility of forming a large number of evenly spread isolated vacancies and/or relatively small cluster defects using neutron irradiation, while avoiding large extensive cluster defects formed by extensive cascade damage as a result of neutrons which are too high in energy. This requires the careful selection of a neutron flux of an appropriate energy. It is advantageous to select an energy which results in cluster defects having a maximum size limitation for individual clusters. This is consistent with the understanding that it is desirable to form relatively small, relatively evenly spread defect clusters rather than large sprawling regions of cascade damage. Accordingly, it is preferable that each of a plurality of cluster defects has a maximum size no greater than 50 atoms in length, more preferably no greater than 20 atoms in length, more preferably still no greater than 10 atoms in length, and most preferably no greater than 5 atoms in length. The size of the cluster defects can be measured using transmission electron microscopy (TEM) or positron annihilation techniques.

As previously described, it is advantageous to keep the temperature of the diamond material relatively low during irradiation as an increase in temperature can result in a decrease in the number density of defects. One advantage of neutron irradiation is that it tends not to raise the temperature of the diamond material as much as, for example, electron irradiation. As such, according to certain embodiments of the present invention no active cooling is required.

Another advantage of neutron irradiation is that the diamond material does not usually need to be rotated during neutron irradiation to achieve a relatively even distribution of defects. In fact, one advantage of neutron irradiation over, for example, electron irradiation is that neutrons tend to penetrate more easily through an entire sample to obtain a relatively even distribution of defects without rotation of the sample. It can thus be easier to achieve a high dose of radiation through a sample of diamond in a commercially viable way.

Care needs to be taken when selecting the diamond material to be neutron irradiated so that samples do not remain radioactive for an unreasonably long period of time post irradiation. It is therefore necessary to ensure the diamond material selected for neutron irradiation contains substantially no metallic or other inclusions which will remain radioactive for an unreasonable length of time after exposure to neutron irradiation. In this regard, the diamond material may only be released post neutron irradiation if the radioactivity is less than 4 Bq/g. The diamond material selected for neutron irradiation should therefore preferably contain no metallic inclusions having a size equal to or less 10 μm, 5 μm, or 1 μm. The metallic inclusions should preferably be equal to or less than 0.1%, 0.01%, 0.001%, or 0.0001% of the total mass of the diamond. The diamond material should also preferably be acid cleaned immediately before irradiation to remove any potentially radioactive species from the surface, thereby ensuring that the level of radioactivity falls below 4 Bq/g after being held to 'cool' for equal to or less than 6 months, 4 months, 2 months, 1 month, 2 weeks, or 1 week.

Several CVD diamond samples have been irradiated with neutrons (typically containing approximately 0.1-0.5 ppm N). Imperial College's Ur$^{235}$ Consort reactor at Silwood Park, Ascot, UK was used for these treatments (this reactor has now been decommissioned—an alternative can be that found at Delft University, Holland.) The diamond material was typically irradiated for between 14 and 28 hours, with an energy distribution within the reactor which peaked at 1 MeV, 59% of the neutrons falling into the energy range of 0.2 to 2.2 MeV and 86% of neutrons falling into the energy range 0.2 to 12 MeV.

The diamond samples therefore received a dose of approximately $5\times10^{15}$ to $1\times10^{16}$ neutrons/cm$^2$. A colour change was observed from colourless to yellow-green as a result of the neutron irradiation. Using cold UV-Visible spectroscopic measurements (using the same method of calculation as described above) the concentration of isolated neutral vacancies was measured to be in the range of 0.2-0.51 ppm ($2\times10^{16}$ to $5.1\times10^{16}$ vacancies/cm$^3$). There was a clear broadening of the GR1 peak compared to corresponding electron irradiated samples, which shows evidence for the formation of vacancy clusters in addition to isolated vacancies.

The resulting material can be used, for example, to form a cutting blade. The cutting blade can be cut out of a blank plate using, for example, a laser. The irradiated material can be optionally annealed at approximately 700° C.

Gamma Irradiation

Gamma rays can also be used to form vacancy defects within a diamond material. For Gamma radiation, the irradiation may have an energy in the range 0.1 to 12 MeV, 0.2 to 10 MeV, or 0.3 to 8 MeV. The dosage of gamma ray irradiation may be $5\times10^{16}$ γ-ray/cm$^2$ or greater, in the range $1\times10^{17}$ to $5\times10^{21}$ γ-ray/cm$^2$, or in the range $5\times10^{17}$ to $1\times10^{21}$ γ-ray/cm$^2$. Again, nitrogen impurities can be used to optimize the affect of introducing vacancies on the toughness and/or wear resistance of the diamond material.

While this invention has been particularly shown and described with reference to preferred embodiments, it will be understood to those skilled in the art that various changes in form and detail may be made without departing from the scope of the invention as defined by the appendant claims.

The invention claimed is:

1. A method comprising:
  selecting a diamond material;
  irradiating the diamond material to increase toughness and/or wear resistance of the diamond material; and
  processing the diamond material into one or more diamond tool pieces,
  wherein the diamond material is selected from the group consisting of:
    a HPHT diamond material having a total equivalent isolated nitrogen concentration in the range 1 to 600 ppm;
    a CVD diamond material having a total equivalent isolated nitrogen concentration in the range 0.005 to 100 ppm; and
    a natural diamond material having a total nitrogen concentration in the range 1 to 2000 ppm, and
  wherein the irradiating comprises controlling energy and dosage of irradiation to provide the diamond material with a plurality of isolated vacancy point defects, the isolated vacancy point defects having a concentration in a range $1\times10^{14}$ to $1\times10^{21}$ vacancies/cm$^3$.

2. A method according to claim 1, wherein the HPHT diamond material has a total equivalent isolated nitrogen concentration in the range 10 to 300 ppm, 10 to 200 ppm, 50 to 250 ppm, 100 to 200 ppm, 10 to 100 ppm, or 10 to 50 ppm.

3. A method according to claim 1, wherein the CVD diamond material has a total equivalent isolated nitrogen concentration in the range 0.01 to 50 ppm, 0.05 to 20 ppm, 0.08 to 5 ppm, or 0.1 to 2 ppm.

4. A method according to claim 1, wherein the natural diamond material has a total nitrogen concentration in the range 200 to 2000 ppm, 500 to 1500 ppm, 800 to 1300 ppm, or 1000 to 1200 ppm.

5. A method according to claim 1, wherein the irradiating comprises irradiating with electrons, neutrons, X-rays, gamma rays, protons, or alpha particles.

6. A method according to claim 1, wherein the irradiating comprises radiation which has sufficient energy to generate isolated vacancies or small cluster defects having a maximum length no greater than 50 atoms.

7. A method according to claim 6, wherein the irradiating introduces a plurality of cluster defects into the diamond material, each cluster defect having a maximum length no greater than: 20 atoms; 10 atoms; or 5 atoms in length.

8. A method according to claim 1, wherein the irradiating comprises irradiation below an energy and dose rate which would lead to amorphization of the diamond material.

9. A method according to claim 1, wherein the irradiating comprises irradiating the diamond material above an energy and dose rate which leads to a change in colour of the diamond material.

10. A method according to claim 1, wherein the irradiating is performed before, during, or after the processing.

11. A method according to claim 1, wherein the selecting comprises selecting one or more of a natural diamond material, a synthetic diamond material, a high pressure high temperature (HPHT) diamond material, a chemical vapour deposition (CVD) diamond material, a single crystalline diamond material, a polycrystalline diamond material, a diamond-like-carbon material, a diamond, a Type Ib diamond material, and a composite diamond material.

12. A method according to claim 1, wherein the irradiating comprises irradiating the diamond material to a depth of: 1 μm or greater; 10 μm or greater; 100 μm or greater; 500 μm or greater; 1 mm or greater; or
  throughout a total thickness of the diamond material.

13. A method according to claim 1, wherein the irradiating is performed at a temperature of: 500° C. or less; 400° C. or less; 300° C. or less; 200° C. or less; 100° C. or less; or 50° C. or less.

14. A method according to claim 1, further comprising:
  cooling the diamond material during the irradiating.

15. A method according to claim 1, further comprising:
  annealing the diamond material.

16. A method according to claim 15, wherein the annealing is performed before, during or after the irradiating.

17. A method according to claim 1, wherein the diamond material is not exposed to a substantial annealing step.

18. A method according to claim 1, wherein the processing comprises shaping the diamond material to form a working surface.

19. A method according to claim 1, wherein the processing comprises forming one of: a wear part; a dresser; a wire drawing die; a gauge stone; and a cutter.

20. A method according to claim 1, further comprising: incorporating the one or more diamond tool pieces into one or more tools.

21. A method according to claim 20, wherein the irradiating is performed before, during, or after the incorporating.

22. A method according to claim 1, wherein the vacancy point defects have a concentration in the range: $1\times10^{14}$ to $1\times10^{21}$ vacancies/cm$^3$; $1\times10^{15}$ to $1\times10^{21}$ vacancies/cm$^3$; $5\times10^{15}$ to $1\times10^{20}$ vacancies/cm$^3$; $1\times10^{16}$ to $5\times10^{19}$ vacancies/cm$^3$; or $5\times10^{16}$ to $1\times10^{19}$ vacancies/cm$^3$.

23. A tool piece manufactured using a method according to claim 1.

24. A tool piece comprising diamond material irradiated to increase toughness and/or wear resistance of the diamond material, wherein the diamond material is selected from the group consisting of:
a HPHT diamond material having a total equivalent isolated nitrogen concentration in the range 1 to 600 ppm;
a CVD diamond material having a total equivalent isolated nitrogen concentration in the range 0.005 to 100 ppm; and
a natural diamond material having a total nitrogen concentration in the range 1 to 2000 ppm,
wherein the diamond material comprises isolated vacancy point defects having a concentration in a range $1\times10^{14}$ to $1\times10^{21}$ vacancies/cm$^3$.

25. A tool piece according to claim 24, wherein the HPHT diamond material has a total equivalent isolated nitrogen concentration in the range 10 to 300 ppm, 10 to 200 ppm, 50 to 250 ppm, 100 to 200 ppm, 10 to 100 ppm, or 10 to 50 ppm.

26. A tool piece according to claim 25, wherein the CVD diamond material has a total equivalent isolated nitrogen concentration in the range 0.01 to 50 ppm, 0.05 to 20 ppm, 0.08 to 5 ppm, or 0.1 to 2 ppm.

27. A tool piece according to claim 24, wherein the natural diamond material has a total nitrogen concentration in the range 200 to 2000 ppm, 500 to 1500 ppm, 800 to 1300 ppm, or 1000 to 1200 ppm.

28. A tool piece according to claim 24, wherein the diamond material comprises a plurality of vacancy point defects, the vacancy point defects having a concentration in the range: $1\times10^{15}$ to $1\times10^{21}$ vacancies/cm$^3$; $5\times10^{15}$ to $1\times10^{20}$ vacancies/cm$^3$; $1\times10^{16}$ to $5\times10^{19}$ vacancies/cm$^3$; or $5\times10^{16}$ to $1\times10^{19}$ vacancies/cm$^3$.

29. A tool piece according to claim 24, wherein the diamond material comprises a plurality of cluster defects, the cluster defects having a concentration in the range: $1\times10^{14}$ to $1\times10^{21}$ clusters/cm$^3$; $1\times10^{15}$ to $1\times10^{21}$ clusters/cm$^3$; $5\times10^{15}$ to $1\times10^{20}$ clusters/cm$^3$; $1\times10^{16}$ to $5\times10^{19}$ clusters/cm$^3$; or $5\times10^{16}$ to $1\times10^{19}$ clusters/cm$^3$.

30. A tool piece according to claim 24, wherein the diamond material comprises a plurality of cluster defects, each cluster defect having a maximum length no greater than: 50 atoms; 20 atoms; 10 atoms; or 5 atoms in length.

31. A tool piece according to claim 24, where in the diamond material is blue, orange, brown, green, red, purple, or black.

32. A tool piece according to claim 24, where in the tool piece is one of: a wear part; a dresser; a wire drawing die; a gauge stone; and a cutter.

33. A tool comprising one or more tool pieces according to claim 24.

* * * * *